(12) United States Patent
Jaing et al.

(10) Patent No.: US 6,514,814 B2
(45) Date of Patent: Feb. 4, 2003

(54) CAPACITOR CONTAINING AMORPHOUS AND POLYCRYSTALLINE FERROELECTRIC FILMS AND FABRICATION METHOD THEREFOR, AND METHOD FOR FORMING AMORPHOUS FERROELECTRIC FILM

(75) Inventors: Cheng-Chung Jaing, Hsinchu (TW); Jyh-Shin Chen, Hsinchu (TW); Jen-Inn Chyi, Chung-Li (TW); Jeng-Jiing Sheu, Chung-Li (TW)

(73) Assignee: Precision Instrument Development Center, National Science Council, Hsinchu (TW)

( * ) Notice: Subject to any disclaimer, the term of this patent is extended or adjusted under 35 U.S.C. 154(b) by 0 days.

(21) Appl. No.: 09/884,029

(22) Filed: Jun. 20, 2001

(65) Prior Publication Data

US 2001/0044164 A1 Nov. 22, 2001

Related U.S. Application Data

(62) Division of application No. 09/237,662, filed on Jan. 27, 1999.

(30) Foreign Application Priority Data

Oct. 27, 1998 (TW) .................................. 87117803 A

(51) Int. Cl.$^7$ ................................................ H01L 21/8242
(52) U.S. Cl. ........................................ 438/240; 438/785
(58) Field of Search ................................. 438/3, 240, 778, 438/785

(56) References Cited

U.S. PATENT DOCUMENTS

| 5,471,364 A | 11/1995 | Summerfelt et al. |
| 5,978,207 A | * 11/1999 | Anderson et al. ........... 361/311 |
| 6,172,385 B1 | * 1/2001 | Duncombe et al. ......... 257/295 |

FOREIGN PATENT DOCUMENTS

| JP | 402229472 A | * 9/1990 |
| JP | 410200059 A | * 7/1998 |

* cited by examiner

Primary Examiner—Olik Chaudhuri
Assistant Examiner—Ginette Peralta
(74) Attorney, Agent, or Firm—Bacon & Thomas

(57) ABSTRACT

A preparation for forming a thin film capacitor includes forming an amorphous ferroelectric film, such as barium strontium titanate [(Ba,Sr)TiO$_3$] film, for use as an interface between a metal electrode and a polycrystalline ferroelectric film, such as (Ba,Sr) TiO$_3$ film. The polycrystalline ferroelectric film serves as a dielectric layer of the thin film capacitor in view of the fact that the polycrystalline ferroelectric film has a high dielectric constant. The amorphous ferroelectric film serves as a buffer layer for inhibiting the leakage current of the thin film capacitor. The amorphous ferroelectric film is grown by sputtering and by introducing a working gas, such as argon, and a reactive gas, such as oxygen, into a reaction chamber in which a plasma is generated at room temperature.

18 Claims, 5 Drawing Sheets

CAPACITOR CONTAINING AMORPHOUS AND POLYCRYSTALLINE FERROELECTRIC FILMS AND FABRICATION METHOD THEREFOR, AND METHOD FOR FORMING AMORPHOUS FERROELECTRIC FILM

This application is a divisional application of pending U.S. application Ser. No. 09/237,662, filed Jan. 27, 1999 (of which the entire disclosure of the pending, prior application is hereby incorporated by reference).

FIELD OF THE INVENTION

The present invention relates generally to a thin film capacitor, and more particularly to a thin film capacitor having amorphous and polycrystalline ferroelectric films serving as a dielectric material. In addition, the present invention also relates to a preparation of the amorphous ferroelectric film by sputtering.

BACKGROUND OF THE INVENTION

In light of the miniaturization of the semiconductor element, and the high dielectric constant of the barium strontium titanate [hereinafter abbreviated as $(Ba,Sr)TiO_3$] film, the $(Ba,Sr)TiO_3$ film is used as a dielectric layer of a thin film capacitor of the integrated circuit. The magnitude of the leakage current of the thin film capacitor is directly proportional to the loss of the electric charge that is stored in the thin film capacitor. For this reason, a solution to bring about a reduction in the leakage current of the thin film capacitor is sought by the industry.

The $(Ba,Sr)TiO_3$ film, which is prepared by sputtering at high temperature or at low temperature preceding a high temperature annealing, exists in the polycrystalline form. When the polycrystalline $(Ba,Sr)TiO_3$ film is used as the dielectric layer of a thin film capacitor, the thin film capacitor has a tendency to exhibit a relatively large leakage current. In order to inhibit the leakage current, a thicker $(Ba,Sr)TiO_3$ film may be used. Alternatively, a high temperature oxygen treatment may be carried out in a furnace tube after the formation of the electrodes of the thin film capacitor. However, the sputtering time must be prolonged in the former approach. The latter requires an additional high temperature process.

U.S. Pat. No. 5,471,364 discloses an electrode interface for use together with a material having high dielectric constant. In other words, a buffer layer having a low leakage current density is formed between the electrodes and the high dielectric constant material. In the embodiment of the above disclosure, $(Ba,Sr)TiO_3$ is used as a high dielectric constant material, whereas $SrTiO_3$ is used as the buffer layer. Even though the crystalline forms of $(Ba,Sr)TiO_3$ and $SrTiO_3$ are not explained in the patent specification, $(Ba,Sr)TiO_3$ film and $SrTiO_3$ film, which are formed by the sputtering method, always exist in the polycrystalline form.

SUMMARY OF THE INVENTION

The first objective of the present invention is to provide a method for forming an amorphous ferroelectric thin film by sputtering. The amorphous ferroelectric thin film continues to exist as the amorphous ferroelectric thin film in the wake of a high temperature annealing treatment.

The second objective of the present invention is to provide a thin film capacitor having an amorphous ferroelectric thin film/polycrystalline ferroelectric thin film.

The third objective of the present invention is to provide a process for making a thin film capacitor having an amorphous ferroelectric thin film/polycrystalline ferroelectric thin film.

The first objective of the present invention is attained by a method for forming an amorphous ferroelectric thin film by sputtering, as defined in claim 1 of the present application. The amorphous ferroelectric thin film may have a composition of $(Ba,Sr,Pb,La)(Ti,Zr)O_3$, preferably, of $(Ba, Sr)TiO_3$. In the wake of being treated by a high temperature annealing, the amorphous ferroelectric thin film formed by the method of the present invention continues to remain in the amorphous form. If the flow rate of the reactive gas in the method of claim 1, such as oxygen, was reduced to substantially zero, the ferroelectric thin film so formed was amorphous; however, the amorphous ferroelectric thin film was transformed into the polycrystalline form by a high temperature annealing treatment. Or under the circumstance that the flow rate of the reactive gas (oxygen) was lowered to substantially zero, and that the substrate temperature was raised to a high temperature, such as >400° C., the ferroelectric thin film formed by the method of the present invention was in the polycrystalline form. It was found that the crystallinity of the ferroelectric thin film improved in response to each increment in the substrate temperature. The phenomenon of the amorphous ferroelectric thin film formed by the method of the present invention continuing to remain in the amorphous form as described above is not completely understood by this inventor of the present invention. It is a presumption of this inventor that the energy of the sputtering source might have been dispersed by the reactive gas which was introduced into the process.

The thin film capacitor of the second objective of the present invention and the method for forming the thin film capacitor of the third objective of the present invention are respectively defined in claim 8 and claim 15 of the present application. According to the present invention, the leakage current of the polycrystalline ferroelectric thin film (used as a dielectric layer) is inhibited when the amorphous ferroelectric thin film is used as a buffer layer of the thin film capacitor.

Preferably, only at an interface between the bottom metal electrode and the dielectric layer of the thin film capacitor is provided with the buffer layer.

Apparently, an add-on amorphous ferroelectric thin film serving as an add-on buffer layer may be provided at an interface between the polycrystalline ferroelectric thin film and an upper electrode of the thin film capacitor of the present invention. The add-on buffer layer is intended to inhibit further the leakage current of the thin film capacitor. The amorphous and the polycrystalline ferroelectric thin films can independently have the composition of $(Ba,Sr,Pb, La)(Ti,Zr)O_3$, preferably, $(Ba,Sr)TiO_3$. Preferably, the amorphous and the polycrystalline ferroelectric thin films have substantially the same composition.

DETAILED DESCRIPTION OF THE INVENTION

Figure 2:
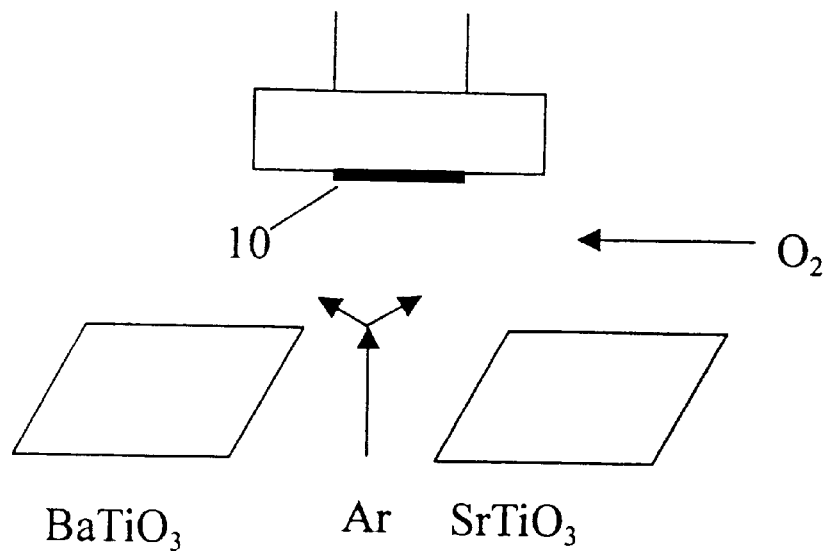
FIG. 2 shows a schematic view of growing an amorphous $(Ba,Sr)TiO_3$ thin film 50 and a polycrystalline $(Ba,Sr)TiO_3$ thin film 60 in FIG. 1 by sputtering.

The present invention discloses an amorphous ferroelectric thin film for use in improving interfacial properties between a ferroelectric thin film having a high dielectric constant and a metal electrode. Typically, the amorphous ferroelectric thin film is used as a buffer layer between a metal electrode and a dielectric layer of polycrystalline ferroelectric material of a thin film capacitor for reducing effectively the leakage current of the thin film capacitor.

An amorphous ferroelectric material having a composition of $(Ba,Sr,Pb,La)(Ti,Zr)O_3$ is suitable for use in the present invention. An amorphous ferroelectric materials having a $(Ba,Sr)TiO_3$ composition is recommended for used in the present invention.

The present invention discloses a method for growing a thin film of the amorphous ferroelectric material on a substrate by sputtering which is carried out in a reaction chamber under the following conditions:

temperature of the substrate or the reaction chamber: 25° C.–150° C,.

pressure in the reaction chamber: 5–100 mtorr, flow rate of a working gas introduced into the reaction chamber: 10–80 SCCM, and flow rate of a reactive gas introduced into the reaction chamber: 10–80 SCCM.

The ratio of the reactive gas flow rate and the working gas flow rate ranges between 0.25 and 1.0.

The amorphous ferroelectric thin film grown by the method remains in the amorphous state even after a high-temperature annealing.

Preferably, the temperature of the substrate or the reaction chamber is room temperature.

Preferably, the ratio of the working gas flow rate and the reactive gas flow rate is about 1:1, whereas the pressure in the reaction chamber is about 6.8 mtorr.

The present invention also discloses a thin film capacitor having improved electrical properties and consisting of a bottom metal electrode, an upper metal electrode, and a polycrystalline ferroelectric thin film serving as a dielectric layer between the upper metal electrode and the bottom metal electrode. The thin film capacitor of the present invention is characterized in design in that an interface between the dielectric layer and the upper metal electrode or the bottom metal electrode is further provided with an amorphous ferroelectric thin film serving as a buffer layer. Preferably, the thin film capacitor of the present invention has this buffer layer only at the interface between the bottom metal electrode and the dielectric layer. More preferably, the thin film capacitor of the present invention is provided with the buffer layer at the interface between the dielectric layer and the bottom metal electrode, as well as at the interface between the dielectric layer and the upper metal electrode.

The polycrystalline ferroelectric thin film suitable for use in the thin film capacitor of the present invention may be a prior art polycrystalline ferroelectric thin film having a composition such as $(Ba,Sr,Pb,La)(Ti,Zr)O_3$. Preferably, this polycrystalline ferroelectric thin film has a composition of $(Ba,Sr)TiO_3$. This polycrystalline ferroelectric thin film may be further doped with other metal ions.

The present invention discloses a method for preparing a thin film capacitor having improved electrical properties. The method includes the following steps of:

(a) preparing a bottom metal electrode;

(b) growing on a surface of the bottom metal electrode an amorphous ferroelectric thin film by sputtering;

(c) growing a polycrystalline ferroelectric thin film on the amorphous ferroelectric thin film; and (d) preparing an upper metal electrode on the polycrystalline ferroelectric thin film.

Preferably, the sputtering referred to in step (b) is carried out in accordance with the method of the present invention.

The bottom metal electrode, the upper metal electrode, and the polycrystalline ferroelectric thin film can be prepared by the prior art methods, including (but not limited to) the physical vapor deposition.

Preferably, the polycrystalline ferroelectric thin film in step (c) is grown by physical vapor deposition, and more preferably by sputtering. The amorphous ferroelectric thin film in step (b) and the polycrystalline ferroelectric thin film in step (c) are continuously grown by sputtering carried out in the same reaction chamber. The sputtering of step (c) is carried out by introducing only the working gas (argon) into the reaction chamber and keeping the temperature of the substrate between 350° C. and 600° C., while the rest of the operational parameters remain the same as those in step (b).

Selectively, the amorphous ferroelectric thin film in step (b) and the polycrystalline ferroelectric thin film in step (c) may be formed by continuously sputtering at a temperature ranging between the room temperature and 150° C., with the former involving the introduction of the working gas (argon) and the reactive gas (oxygen) into the reaction chamber, and with the latter involving the introduction of only the working gas (argon) into the reaction chamber, and with the preparation parameters remaining unchanged. Thereafter, an annealing process is carried out between 450° C. and 700° C. The amorphous ferroelectric thin film and the polycrystalline ferroelectric thin film are thus formed.

A preferred embodiment of the present invention is described hereinafter with reference to the accompanying drawings. A plurality of thin film capacitors were prepared in the embodiment such that the thin film capacitors have the amorphous $(Ba,Sr)TiO_3$ thin films various in thickness. An insulation layer 20 of silicon dioxide of 500 nm thickness was grown on a silicon wafer 10 by a thermal oxidation process. Thereafter, a Ti film 30 having a thickness of 50 nm (as an adhesive layer) and a Pt film 40 having a thickness of 120 nm (as a bottom electrode) were deposited by electron beam evaporation. An amorphous $(Ba,Sr)TiO_3$ thin film 50 was formed on the bottom electrode 40 by sputtering for use as a buffer layer. A polycrystalline $(Ba,Sr)TiO_3$ thin film 60 was formed on the buffer layer 50 by sputtering for use as a dielectric layer. A gold film having a thickness of 100 nm was deposited on the dielectric layer 60 by evaporation, and then an upper electrode 70 was formed by lithography. The thin film capacitor shown in FIG. 1 was thus fabricated.

As shown in FIG. 2, the sputtering of the amorphous $(Ba,Sr)TiO_3$ thin film 50 was brought about by a plasma and by a bombardment of a $BaTiO_3$ target and a $SrTiO_3$ target. The substrate 10 was rotated. The working gas argon (Ar)

was introduced into a reaction chamber via the proximity of the targets, whereas the reactive gas oxygen ($O_2$) was introduced between the targets and the substrate 10. The flow rates of the working gas argon and the reactive gas oxygen were respectively 40 SCCM (the flow rate ratio being 1:1). The pressure in the reaction chamber was 6.8 mtorr. The temperature of the reaction chamber was kept at room temperature.

The sputtering of the polycrystalline (Ba,Sr)TiO$_3$ thin film 60 was carried out immediately following the formation of the amorphous (Ba,Sr)TiO$_3$ thin film 50 by terminating the introduction of the reactive gas oxygen and raising the temperature of the substrate 10 to 540° C. while the rest of the operational parameters remained unchanged. In other words, only the working gas argon was introduced into the reaction chamber (the flow rate being 40 SCCM). The pressure control by pumping speed was kept at 6.8 mtorr.

Figure 1:
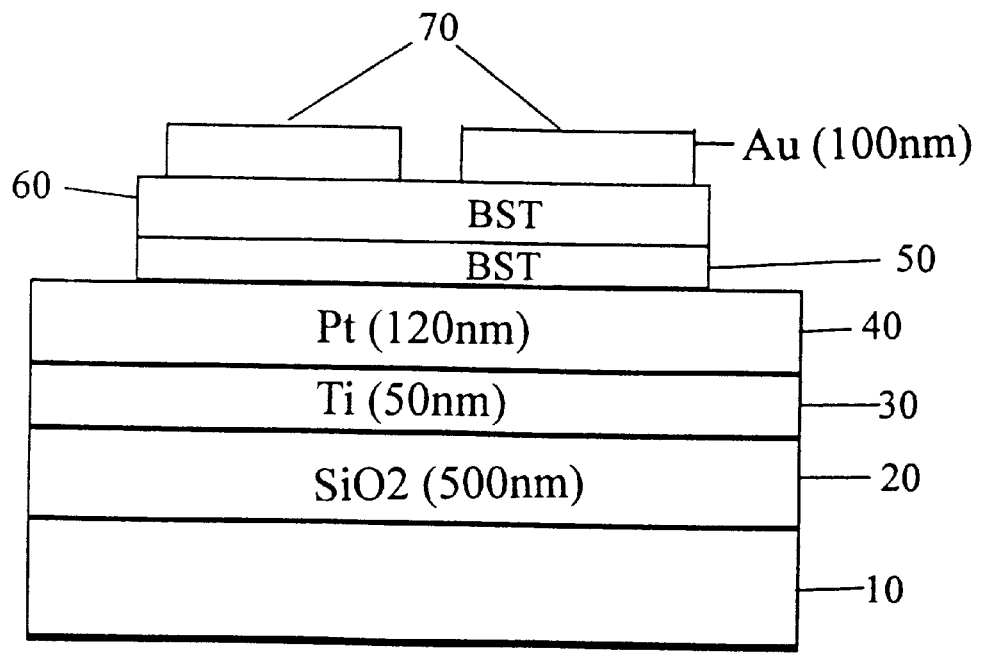
FIG. 1 shows a sectional schematic view of a thin film capacitor made by a preferred embodiment of the present invention.
Figure 3B:
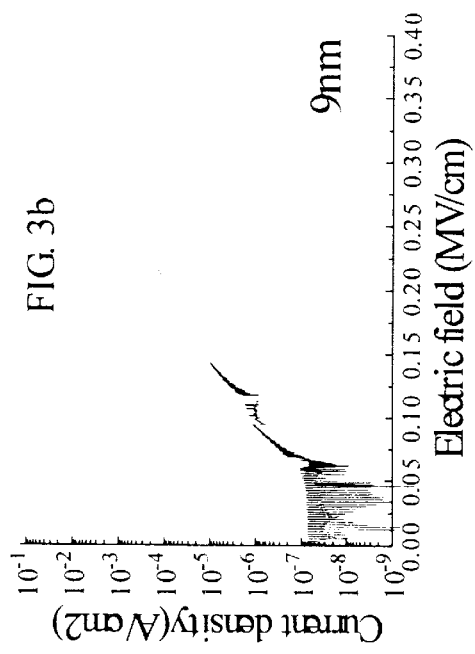
FIGS. 3a–3d show current density-electric field (J-E) characteristic curves of the thin film capacitors at the time when the buffer layer 50 of the thin film capacitor of FIG. 1 is 0 nm, 9 nm, 12 nm and 15 nm in thickness, respectively.
Figure 3D:
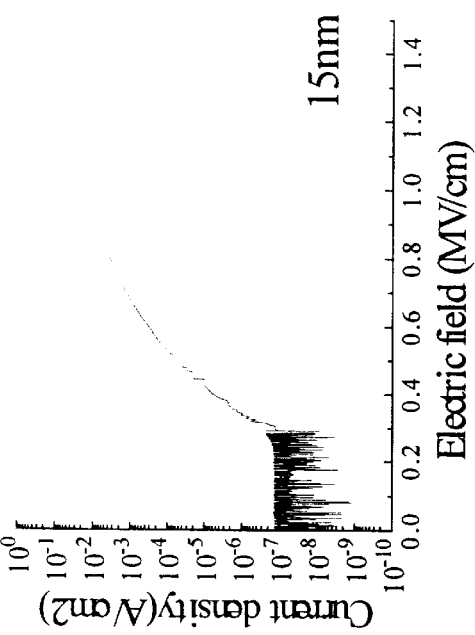
Figure 3A:
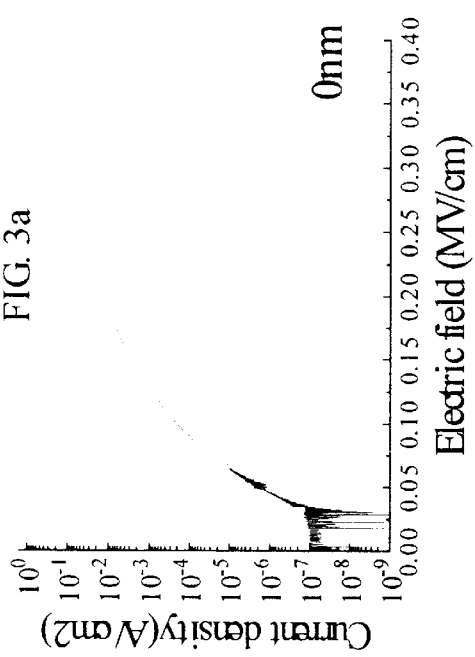
Figure 3C:
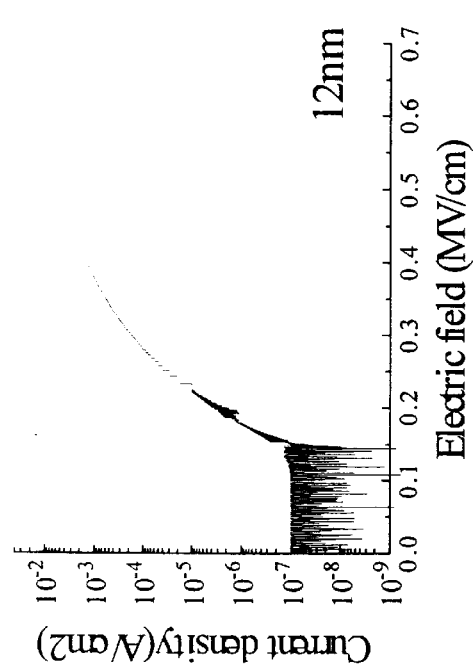
Figure 4:
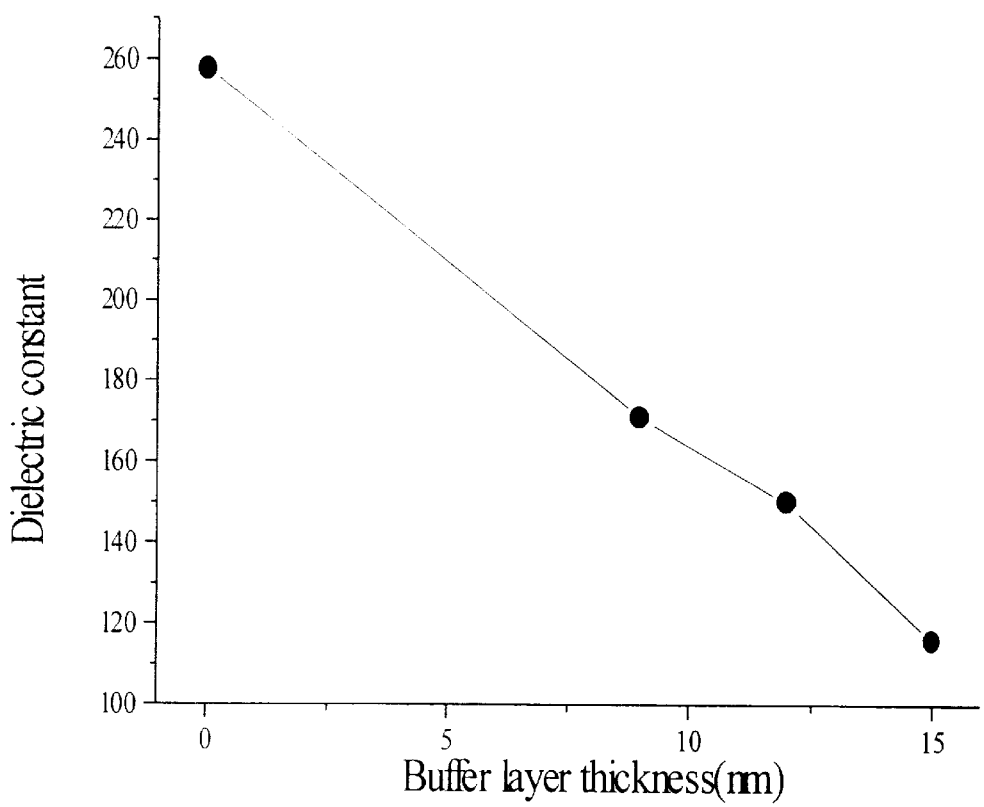
FIG. 4 shows a relationship between the thickness of the buffer layer 50 of the thin film capacitor of FIG. 1 and the total dielectric constant.

FIGS. 3a–3d show the current density-electric field (J–E) characteristic curves of the thin film capacitors in FIG. 1 having the buffer layer 50 of 0 nm, 9 nm, 12 nm and 15 nm in thickness, respectively. The total thickness of the buffer layer 50 and the dielectric layer 60 is kept at about 110 nm (measured by ellipsometer). It can be seen from FIGS. 3 that, as the thickness of the buffer layer 50 increases the breakdown electric field of the thin film capacitor increases. That is the thin film capacitor of the present invention can have an enhanced maximum electric field under which the leakage current density of the thin film capacitor is inhibited under $1\times10^{-7}$ A/cm$^2$, as the thickness of the buffer layer 50 increases. FIG. 4 shows the relationship between the buffer layer 50 thickness and the dielectric constant of the (Ba,Sr)TiO$_3$ films composite (formed of the buffer layer 50 and the dielectric layer 60) in FIG. 1. As shown in FIG. 4, the dielectric constant of the (Ba,Sr)TiO$_3$ films composite decreases as the buffer layer 50 thickness increases. From these results, we can adjust the buffer layer thickness to tune the dielectric constant and breakdown electric field of the (Ba,Sr)TiO$_3$ films composite. The maximum breakdown electric field can reach 0.3 MV/cm as the buffer layer 50 has a thickness of 15 nm.

Figure 5:
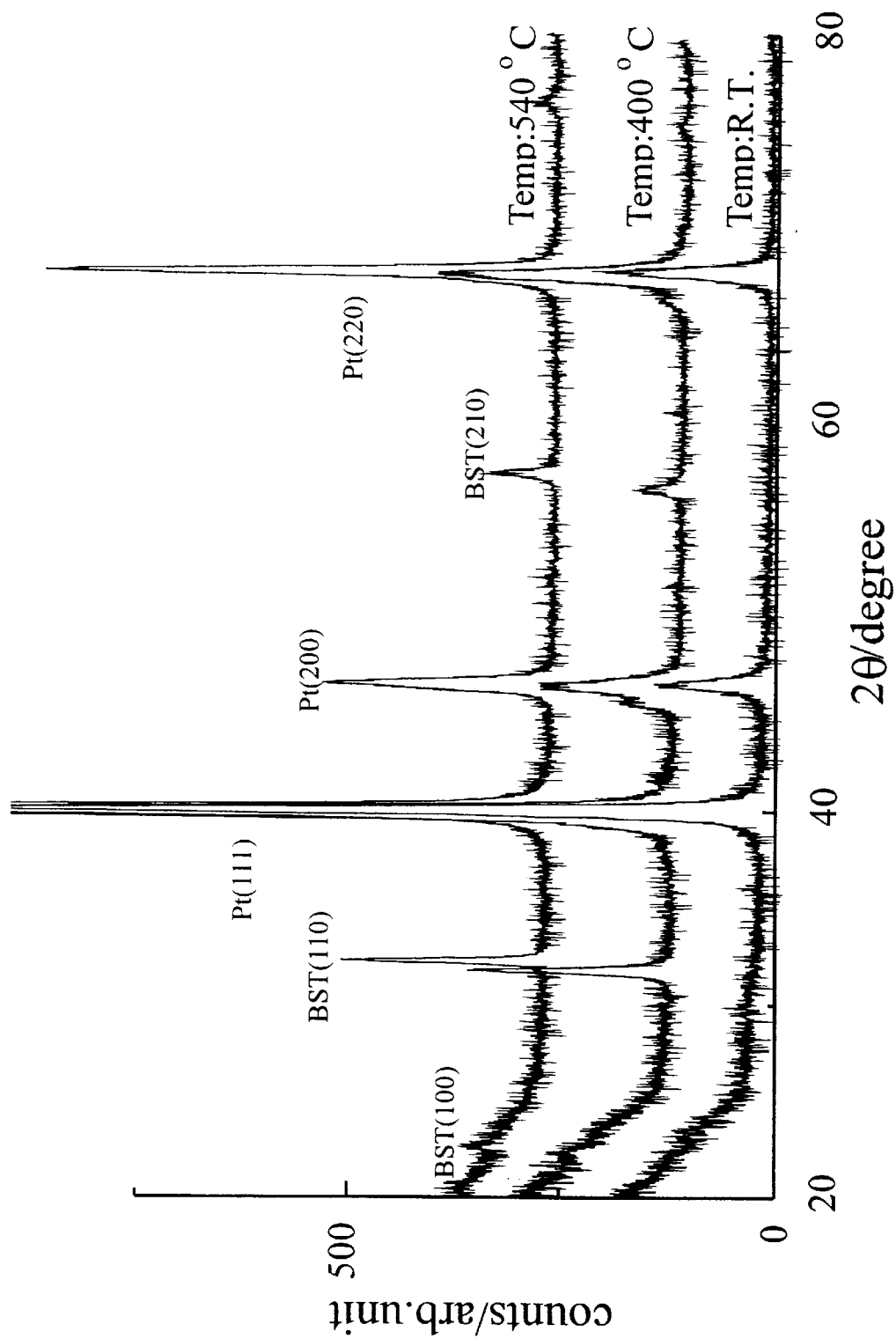
FIG. 5 shows X-ray diffraction spectrums of the polycrystalline $(Ba,Sr)TiO_3$ thin films grown by sputtering under various temperatures on a substrate of Pt (120 nm)/Ti (50 nm)/$SiO_2$ (500 nm)/Si.

FIG. 5 shows the X-ray diffraction spectrums of the polycrystalline (Ba,Sr)TiO$_3$ thin film prepared by sputtering at various substrate temperatures. When the substrate temperature is raised from room temperature to 400° C. and 540° C., more diffraction peaks (BST) of the polycrystalline (Ba,Sr)TiO$_3$ are exhibited in addition to the diffraction peaks (Pt) of the bottom electrode. This polycrystalline (Ba,Sr)TiO$_3$ thin film is thus shown to have a better crystallinity.

Figure 6:
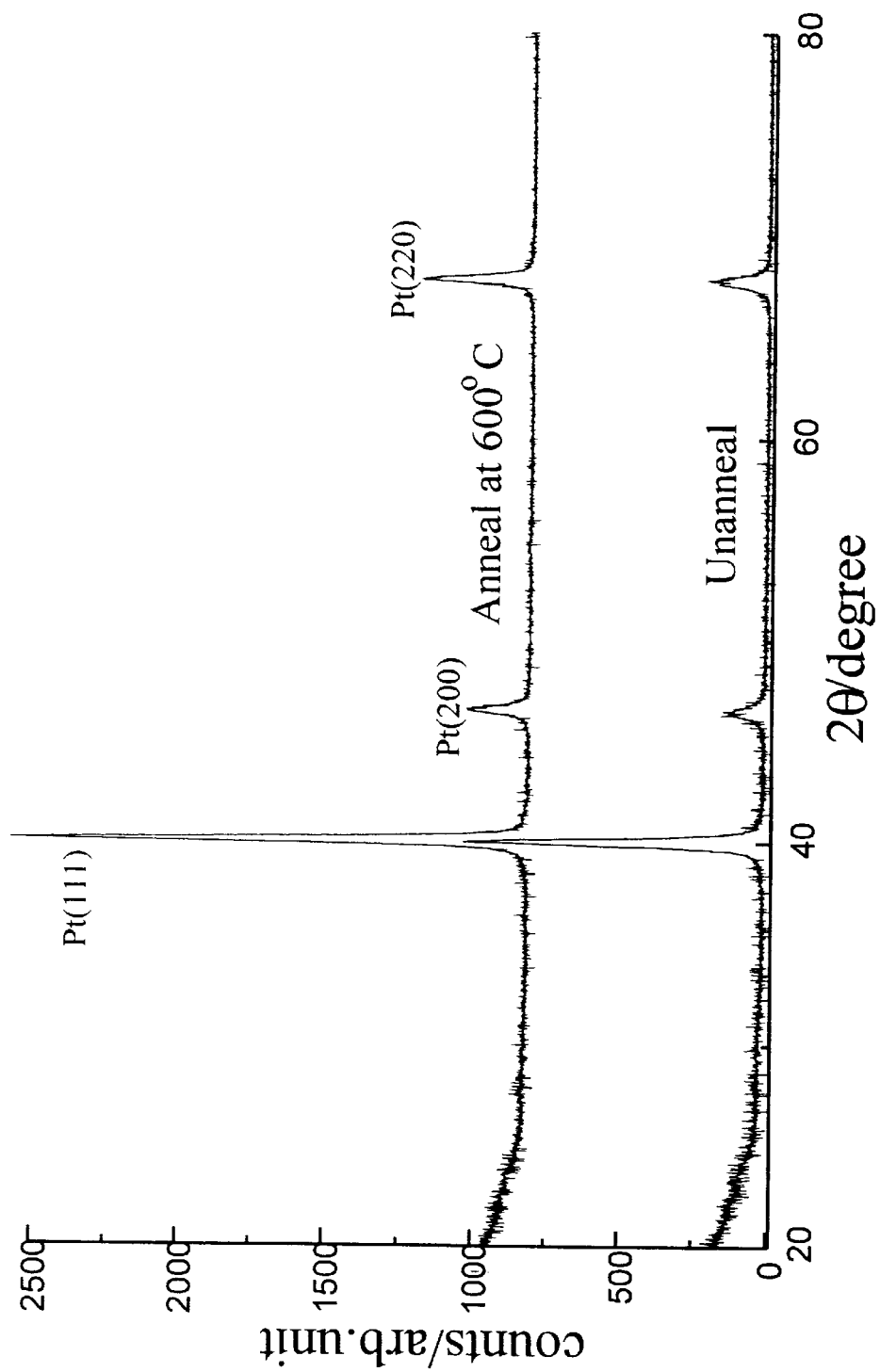
FIG. 6 shows X-ray diffraction spectrums of the amorphous $(Ba,Sr)TiO_3$ thin film of 70 nm in thickness and grown by sputtering on a substrate of Pt (120 nm)/Ti (50 nm)/$SiO_2$ (500 nm)/Si and after annealing at 600° C.

For the research of the crystalline pattern of the buffer layer (Ba,Sr)TiO$_3$ thin film 50, a (Ba,Sr)TiO$_3$ thin film was formed on a substrate of Pt (120 nm)/Ti (50 nm)/SiO$_2$ (500 nm)/Si by sputtering under the same conditions of the buffer layer (Ba,Sr)TiO$_3$ thin film 50. The film thickness was 70 nm. After the annealing at 600° C. for one and half hour, the X-ray diffraction analysis was carried out. The result is shown in FIG. 6. Even with the annealing treatment at 600° C., the (Ba,Sr)TiO$_3$ thin film does not exhibit the diffraction peaks (BST) of the polycrystalline (Ba,Sr)TiO$_3$ thin film as shown in FIG. 5, thereby remaining in the amorphous structure.

Apparently, the amorphous (Ba,Sr)TiO$_3$ thin film 50 and the polycrystalline (Ba,Sr)TiO$_3$ of the above embodiment may also be grown by sputtering at room temperature, with the former involving the introduction of the working gas argon and the reactive gas oxygen into the reaction chamber at the same time, with the latter involving the introduction of only the working gas argon into the reaction chamber, and with the other operational parameters remaining unchanged. Thereafter, an annealing process is carried out at a temperature between 450° C. and 700° C. A composite of the amorphous (Ba,Sr)TiO$_3$ thin film and the polycrystalline (Ba,Sr)TiO$_3$ is thus formed.

From the above embodiment, it is understood that, under the special conditions of the present invention, a layer of amorphous (Ba,Sr)TiO$_3$ thin film is able to be formed by sputtering at an interface between a metal electrode and a polycrystalline (Ba,Sr)TiO$_3$ thin film dielectric layer. The thin film capacitor so fabricated has a characteristic of inhibiting the leakage current. In addition, the present invention will not break the vacuum in the reaction chamber because it is not necessary to remove the substrate therefrom or to replace the target contained therein. It is required that only part of the preparation conditions are changed so as to form the polycrystalline (Ba,Sr)TiO$_3$ thin film on the amorphous (Ba,Sr)TiO$_3$ thin film by sputtering. As a result, a thin film capacitor having a high dielectric constant and a low leakage current can be made by the present invention in a simple way.

What is claimed is:

1. A method for growing an amorphous ferroelectric thin film on a substrate by sputtering which is carried out in a reaction chamber under the following conditions of:

a temperature of the substrate being in the range of 25° C.–150° C.;

a pressure in the reaction chamber being in the range of 5–100 mtorr;

a flow rate of a working gas introduced into the reaction chamber being in the range of 10–80 SCCM; and a flow rate of a reactive gas introduced into the reaction chamber being in the range of 10–80 SCCM;

wherein a ratio of the reactive gas flow rate and the working gas flow rate is in the range of 0.25–1.0;

whereby the amorphous ferroelectric thin film grown remains in the amorphous state even after a high-temperature annealing.

2. The method as defined in claim 1, wherein the temperature of the substrate is room temperature.

3. The method as defined in claim 1, wherein the ratio of the working gas flow rate and the reactive gas flow rate is about 1:1; and wherein the pressure in the reaction chamber is about 6.8 mtorr.

4. The method as defined in claim 1, wherein the amorphous ferroelectric film has a composition of (Ba,Sr,Pb,La)(Ti,Zr)O$_3$.

5. The method as defined in claim 4, wherein the amorphous ferroelectric film has a composition of (Ba,Sr)TiO$_3$.

6. The method as defined in claim 1, where the reactive gas is oxygen.

7. The method as defined in claim 1, wherein the working gas is argon.

8. A method for improving a dielectric property of a polycrystalline ferroelectric film without a substantial change in thickness of the polycrystalline ferroelectric film, the method comprising growing an amorphous ferroelectric film over a portion of the polycrystalline ferroelectric film, wherein the amorphous ferroelectric film is grown by sputtering in a reaction chamber under the following conditions of:

a temperature in the reaction chamber being in the range of 25° C.–150° C.;

a pressure in the reaction chamber being in the range of 5–100 mtorr;

a flow rate of a working gas introduced into the reaction chamber being in the range of 10–80 SCCM; and a flow rate of a reactive gas introduced Into the reaction chamber being in the range of 10–80 SCCM;

wherein a ratio of the flow rate of the reactive gas and the flow rate of the working gas ranges between 0.25 and 1.0.

9. The method as defined in claim 8, wherein the temperature in the reaction chamber is room temperature.

10. The method as defined in claim 8, wherein the ratio of the flow rate of the reactive gas and the flow rate of the working gas is about 1:1; and wherein the pressure in the reaction chamber is about 6.8 mtorr.

11. The method as defined in claim 8, wherein the amorphous ferroelectric film has a composition of (Ba,Sr,Pb,La)(Ti,Zr)$O_3$.

12. The method as defined in claim 11, wherein the amorphous ferroelectric film has a composition of (Ba,Sr)Ti$O_3$.

13. The method as defined in claim 8, wherein the amorphous ferroelectric film and the polycrystalline ferroelectric film have substantially the same composition.

14. The method as defined in claim 8, wherein the reactive gas is oxygen.

15. The method as defined in claim 8, wherein the working gas is argon.

16. The method as defined in claim 8, wherein the polycrystalline ferroelectric film is prepared by physical vapor deposition.

17. The method as defined in claim 8, wherein the polycrystalline ferroelectric film is grown by sputtering; wherein the sputtering for growing the amorphous ferroelectric film and the polycrystalline ferroelectric film are continuously carried out in the same reaction chamber; wherein the latter sputtering is carried out such that only the working gas is introduced into the reaction chamber, and that the temperature in the reaction chamber is kept at 350° C.–600° C., and further that the rest of operational parameters of the latter sputtering are corresponding to those of the former sputtering.

18. The method as defined in claim 8, wherein the polycrystalline ferroelectric film is grown by sputtering; wherein the sputtering for growing the amorphous ferroelectric film and the polycrystalline ferroelectric film are continuously carried out in the same reaction chamber in which the temperature is kept in the range of room temperature to 150° C.; wherein the working gas and the reactive gas are introduced simultaneously into the reaction chamber in the former; wherein only the working gas is introduced into the reaction chamber in the latter such that other operational parameters are not changed; and wherein an annealing treatment is carried out at the temperature ranging between 450° C. and 700° C. after the sputtering for the polycrystalline ferroelectric film.

* * * * *